United States Patent
Liu et al.

(10) Patent No.: US 8,310,037 B2
(45) Date of Patent: Nov. 13, 2012

(54) LIGHT EMITTING APPARATUS AND FABRICATION METHOD THEREOF

(75) Inventors: Chun-Kai Liu, Taipei (TW); Yu-Lin Chao, Hsinchu (TW); Ming-Ji Dai, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 531 days.

(21) Appl. No.: 12/545,862

(22) Filed: Aug. 24, 2009

(65) Prior Publication Data

US 2010/0267176 A1    Oct. 21, 2010

(30) Foreign Application Priority Data

Apr. 20, 2009  (TW) ............................... 98113013 A

(51) Int. Cl.
*H01L 23/02* (2006.01)
(52) U.S. Cl. ............ 257/686; 257/81; 438/109; 438/22; 438/24
(58) Field of Classification Search .................. 257/686
See application file for complete search history.

(56) References Cited

U.S. PATENT DOCUMENTS

| 4,338,577 | A | 7/1982 | Sato et al. |
| 4,604,753 | A | 8/1986 | Sawai |
| 5,024,535 | A | 6/1991 | Winston, Jr. |
| 6,441,558 | B1 | 8/2002 | Muthu et al. |
| 2002/0017710 | A1 * | 2/2002 | Kurashima et al. ........... 257/686 |
| 2003/0148590 | A1 * | 8/2003 | Kellar et al. .................. 438/455 |
| 2005/0279949 | A1 * | 12/2005 | Oldham et al. ............ 250/458.1 |
| 2010/0188443 | A1 * | 7/2010 | Lewis et al. ................... 345/691 |

FOREIGN PATENT DOCUMENTS

WO       2008088892       7/2008

OTHER PUBLICATIONS

"Office Action of Taiwan Counterpart Application", issued on Jul. 18, 2012, p. 1-8, in which the listed reference was cited.

* cited by examiner

*Primary Examiner* — Ajay K Arora
(74) *Attorney, Agent, or Firm* — Jianq Chyun IP Office

(57) ABSTRACT

A light emitting apparatus comprising a substrate, a first functional chip and a first light emitting component is provided. The substrate, the first functional chip, and the first light emitting component have a plurality of first bumps. In addition, the first functional chip has a plurality of first vias. The first light emitting component and the first functional chip are stacked on the substrate. Hence, the first light emitting component is electrically connected to the first functional chip and the substrate by the first vias and the first bumps.

36 Claims, 7 Drawing Sheets

LIGHT EMITTING APPARATUS AND FABRICATION METHOD THEREOF

CROSS-REFERENCE TO RELATED APPLICATION

This application claims the priority benefit of Taiwan application serial no. 98113013, filed on Apr. 20, 2009. The entirety of the above-mentioned patent application is hereby incorporated by reference herein and made a part of specification.

BACKGROUND

1. Technical Field

The present disclosure generally relates to a structure for a semiconductor light source apparatus; more specifically, to a structure for a semiconductor light source apparatus that can measure a plurality of working parameters and adjust the light output accordingly.

2. Description of Related Art

Traditional light sources include fluorescent lamps, incandescent bulbs, light bulbs, and halide lamps. These traditional light sources have the disadvantages of high power consumption, large footprint, low stability, short user lifespan, and lowly coherent output light. Due to these disadvantages, traditional light sources are not adapted for using in many fields, such as digital electronics, optical communication technologies, flat panel display technologies, and biomedical engineering. However, with the advance of semiconductors, various semiconductor light sources have been gradually developed.

These semiconductor light sources include the light emitting diode and the laser diode. Generally speaking, these semiconductor light sources have some common advantages, such as low power consumption, low footprint, high stability, long user lifespan, and output light of high coherence and brightness, as well as output light of multiple wavelengths. Therefore, the semiconductor light source has become increasingly important. In addition, with the development of the blue semiconductor light source, white light can now be emitted by the semiconductor light sources. Hence, the semiconductor light source has slowly replaced the traditional light source in various applications.

Although the semiconductor laser has the above-mentioned advantages, there are still some limitations. One is an intrinsic property of the device, that is, the output power of the semiconductor light source decreases as the device temperature increases. Therefore, the detection of the device temperature of a working semiconductor light source has become an important technique. In conventional methods, device temperature measurement of the semiconductor light source is made by a temperature sensor outside the device. However, the most significant components of the detected temperature values include the outer casing temperature of the semiconductor light source, along with the environmental temperature surrounding the device. Hence, these temperature measurements do not correspond to the real device temperature.

U.S. Pat. No. 4,604,753 (abbreviated as Sawai hereinafter) disclosed a structure of a laser diode. In Sawai, a temperature sensing mechanism (1) and an automated temperature controller (ATC) are provided in the packaging of the laser diode. Thus the ATC can control the size of a working current based on the temperature of the laser diode, and therefore the ATC can stabilize the output power. Hence, the device disclosed in Sawai can effectively measure the device temperature of the laser diode and compensate the device according to the temperature measurements. However, in the fabrication of the device disclosed in Sawai, the electrical connections between the laser diode and the temperature sensor chip are made by wire bonding. The large internal resistance may affect the optical performance of device.

SUMMARY

The present disclosure provides a light emitting apparatus, including a chip module, a first light emitting component, a plurality of first bumps, and a plurality of second bumps. The chip module includes a first functional chip, and the first functional chip includes a plurality of first vias, in which each of the plurality of vias has a first conductive component. In addition, each of the plurality of first bumps is electrically connected to a corresponding first terminal of one of the first conductive components respectively. Each of the plurality of second bumps electrically connects a corresponding second terminal of one of the first conductive components to the first light emitting component. Thus, the first light emitting component can use the plurality of second bumps to be stacked on the chip module.

The present disclosure also provides a method of fabricating a light emitting apparatus. In the method, a chip module and a light emitting component is provided. In addition, at least a first functional chip is provided in the chip module, and a plurality of first vias is formed in the first functional chip. Next, a first conductive component is formed in each of the plurality of vias. Furthermore, a plurality of first bumps are formed, and a plurality of second bumps are formed on the chip module. Herein, each of the plurality of first bumps is electrically connected to a corresponding first terminal of one of the first conductive components. Thus, the first functional chip can use the plurality of first bumps to be stacked on the substrate. Similarly, each of the plurality of second bumps electrically connect a corresponding second terminal of one of the plurality of first conductive components to the light emitting component. Therefore, the first conductive component can use the second bumps to stack on the chip module.

In order to make aforementioned and other objects, features and advantages of the present disclosure more comprehensible, several embodiments accompanied with figures are described in detail underneath.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

Figure 1A:
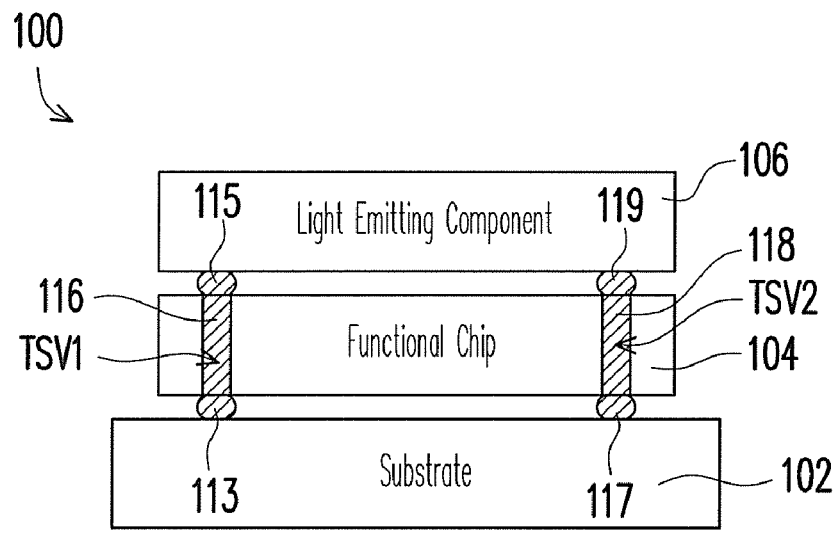
FIG. 1A is a schematic view illustrating a light emitting apparatus according to one exemplary embodiment of the present disclosure.

FIG. 1A is a schematic view illustrating a light emitting apparatus according to one exemplary embodiment of the present disclosure. Referring to FIG. 1A, in the present exemplary embodiment of the disclosure, the light emitting apparatus 100 includes a functional chip 104 and a light emitting component 106. Herein, the light emitting component 106 is stacked on the functional chip 104.

The functional chip 104 includes a plurality of vias, such as via TSV1 and via TSV2, for instance. A conductive component 116 and a conductive component 118 are disposed in each of the vias TSV1 and TSV2, respectively.

In addition, there can be some bumps in the functional chip 104, such as 113, 115, 117, 119 (not illustrated in the figure). Herein, bumps 113 and 117 can be electrically connected to the first terminals of the conductive components 116 and 118, respectively. Bumps 115 and 119 can be electrically connected to the second terminals of the conductive components 116 and 118, in addition to the light emitting component 106. Consequently, the bumps 115 and 119 allow the light emitting component 106 to be stacked on the functional chip 104.

Figure 1B:
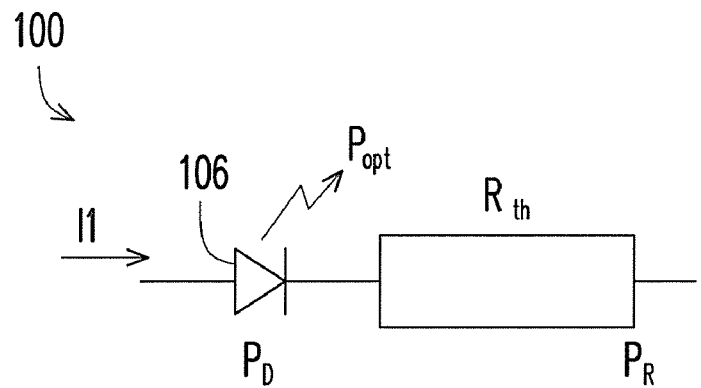
FIG. 1B is an equivalent circuit diagram of the light emitting apparatus found in FIG. 1A.

In some exemplary embodiments of the present disclosure, the light emitting apparatus 100 can include a substrate 102, in which the substrate 102 is electrically connected to the bumps 113 and 117. Therefore, the bumps 113 and 117 allow the functional chip 104 to be stacked on the substrate 102. Detailed descriptions of the aforementioned structures are provided below. FIG. 1B is an equivalent circuit diagram illustrating the light emitting apparatus 100 found in FIG. 1A. As shown in FIG. 1B, I1 is a working current of the light emitting apparatus 100, $P_D$ is an ideal power of a diode, and $P_R$ is an electrical loss due to series resistance. $R_{th}$ is an effective thermal resistance generated by the input working current I1, as described by formula (1), $$R_{th} = \Delta T / P_{el} \quad (1)$$

Herein, $P_{el}$ is a power loss of the light emitting apparatus 100, and $\Delta T$ is a temperature variation of the light emitting apparatus 100.

When the working current I1 is provided to the light emitting apparatus 100, the light emitting apparatus 100 not only emits light, but the light emitting apparatus 100 also generates heat. Formula (2) can be used when only heat is considered as the source of the device thermal resistance, $$R_{thr} = \Delta T / P_{heat} = \frac{\Delta T}{P_{el} - P_{opt}} \quad (2)$$

Herein, $P_{heat}$ is a power loss due to heat generated by the light emitting apparatus 100, and $P_{opt}$ is an output power of the light emitting apparatus 100.

According to the aforementioned formulas (1) and (2), the light emission efficiency ($\eta$) can be described by the formula below:

$$\eta = \frac{P_{opt}}{P_{el}} = \frac{P_{opt}}{P_D + P_R} \quad (3)$$

and the effective thermal resistance can be described as $$R_{th} = (1-\eta) R_{thr} \quad (4)$$

As shown in formula (3), when there is a decrease in the series resistance of the package, the electrical loss $P_R$ is also decreased, and the efficiency $\eta$ is increased. Furthermore, from formula (4), an increase in efficiency $\eta$ results in a drop in the effective thermal resistance $R_{th}$.

The present exemplary embodiment of the disclosure as illustrated in FIG. 1A describes a stacking structure, and the electrical connections are made through vias. Hence, the series resistance value of the light emitting apparatus 100 is substantially low. In other words, the light emission efficiency $\eta$ of the light emitting apparatus 100 can be substantially improved.

Referring again to FIG. 1A, the light emitting component 106 can be a light emitting diode component or a laser diode component, for instance. The functional chip 104 can measure the characteristic parameters of the light emitting component 106 during operation, in which the characteristic parameters include temperature and brightness. The characteristic parameters are used to adjust operational factors such as the size of the working current or the surrounding environmental temperature. Several exemplary embodiments are provided below to further describe the spirit of the present disclosure.

First Embodiment

Figure 2A:
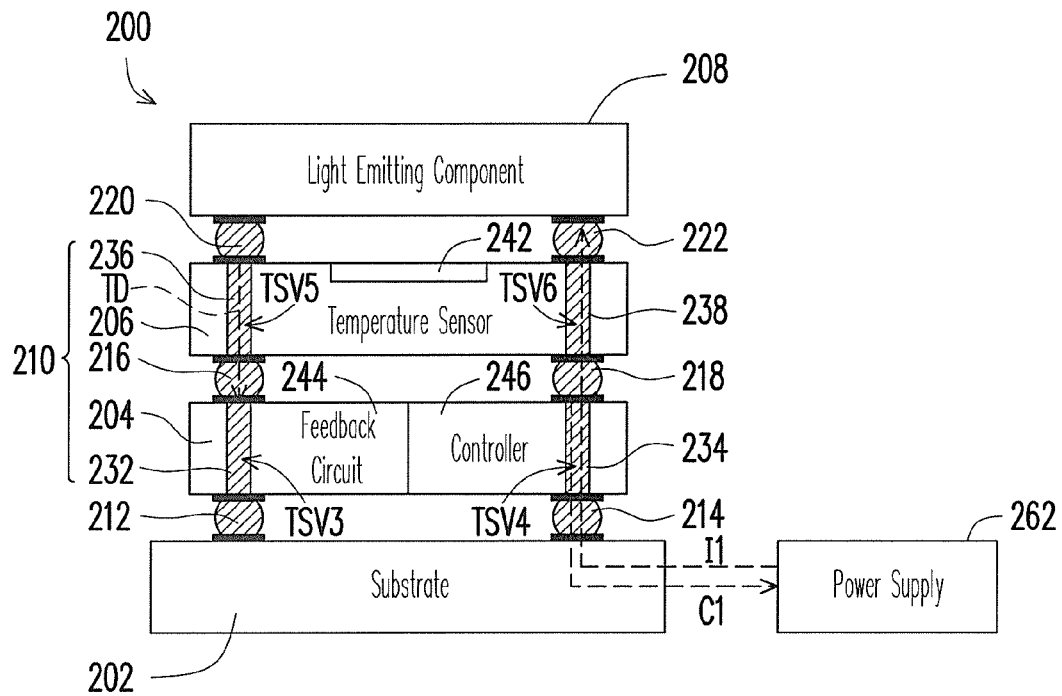
FIG. 2A is a structural diagram illustrating a light emitting apparatus according to the first exemplary embodiment of the present disclosure.

FIG. 2A is a structural diagram illustrating a light emitting apparatus according to the first embodiment of the present disclosure. Referring to FIG. 2A, in the present exemplary embodiment of the disclosure, a light emitting apparatus 200 is provided, including a substrate 202, a light emitting component 208, and a chip module 210. In addition, a plurality of first bumps can be disposed on the substrate 202, such as first bumps 212 and 214, for instance. The first bumps 212 and 214 can be electrically connected to the substrate 202 and the chip module 210. Therefore, the first bumps 212 and 214 allow the chip module 210 to be stacked on the substrate 202. Similarly, a plurality of second bumps is disposed on the chip module 210, such as 220 and 222, for instance. The second bumps 220 and 222 can be electrically connected to the light emitting component 208 and the chip module 210. Hence, the light emitting component 208 can use the second bumps 220 and 222 to stack on the chip module 210.

In the present exemplary embodiment of the disclosure, the chip module 210 can include a plurality of third bumps (the third bumps 216 and 218, for instance), and the functional chips 204 and 206. Each of the functional chips 204 and 206 includes a plurality of vias, such as the vias TSV3, TSV4, TSV5, and TSV6, for instance. In each of the vias, a conductive component is formed, such as the conductive components 232, 234, 236, and 238, for instance. Herein, the first terminals of the conductive components 232 and 234 can be electrically connected to the first bumps 212 and 214, and thus the functional chip 204 can use the first bumps 212 and 214 to stack on the substrate 202.

In addition, a plurality of third bumps can be formed on the functional chip 204, such as first bumps 216 and 218, for instance. The third bumps 216 and 218 can electrically connect each of the second terminals of the conductive components 232 and 234 to the corresponding first terminals of the conductive components 236 and 238. Therefore, the third bumps 216 and 218 allow the functional chip 206 to be stacked on the functional chip 204. Furthermore, each of the second terminals of the conductive components 236 and 238 can be electrically connected to the corresponding second bumps 220 and 222. Hence, the light emitting component 208 can use the second bumps 220 and 222 to stack on the functional chip 206.

Figure 2B:
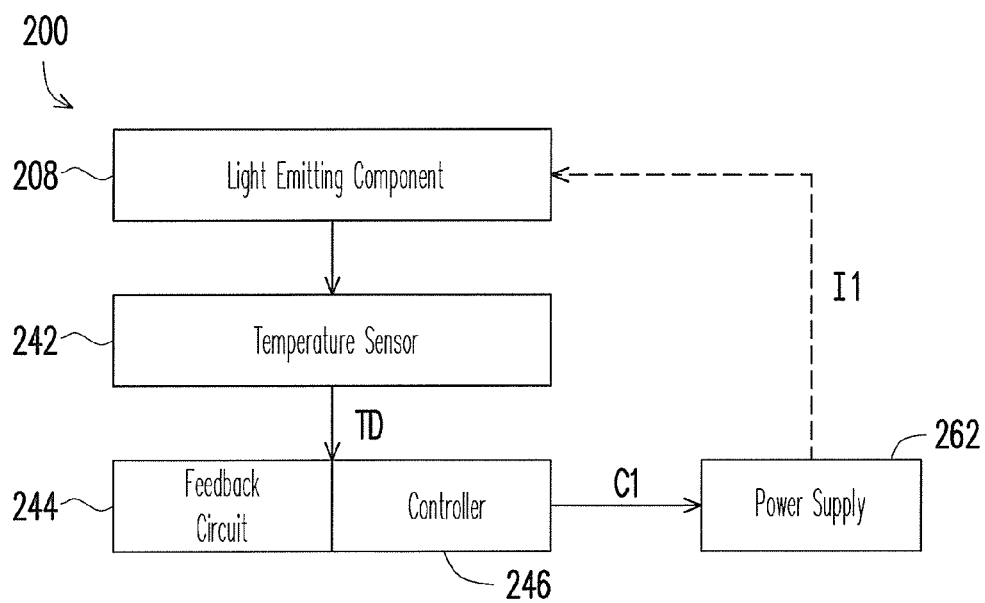
FIG. 2B is a block diagram of an equivalent circuit of the light emitting apparatus 200 found in FIG. 2A.

In the present exemplary embodiment of the disclosure, the functional chip 204 can be a control chip, for instance. The functional chip 206 can be a temperature sensor chip, for instance. FIG. 2B is a block diagram of an equivalent circuit of the light emitting apparatus 200 found in FIG. 2A. Referring to both FIG. 2A and FIG. 2B, the temperature sensor chip 206 can include a temperature sensor 242. The temperature sensor 242 is used for sensing an operational temperature of the light emitting component 208 and generating a temperature sensor signal TD accordingly. In addition, the control chip 204 includes a feedback circuit 244 and a controller 246. Herein, the controller 246 can be electrically connected to an outside power supply 262 through the conductive component 234. The power supply 262 provides a working current I1 needed by the light emitting apparatus 200.

When the temperature sensor 242 senses the operational temperature of the light emitting apparatus 208, the temperature sensor 242 generates the temperature sensor signal TD accordingly. At this time, the feedback circuit 244 can receive the temperature sensor signal TD through the conductive component 236. Based on the temperature sensor signal TD, the controller 246 can send a control signal C1 to the power supply 262 (through the conductive component 234). The power supply 262 determines the value of the working current I1 based on the control signal C1. Furthermore, the working current I1 is transmitted to the light emitting component 208 through the conductive components 234 and 238.

Second Embodiment

Figure 3:
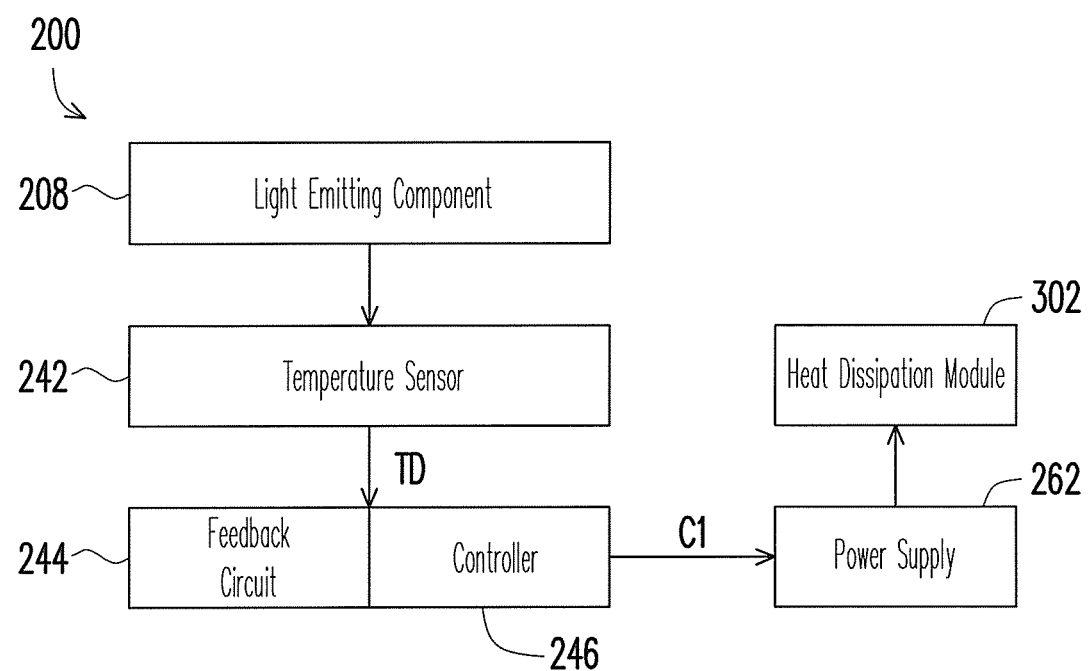
FIG. 3 is a block diagram of an equivalent circuit of a light emitting apparatus found in FIG. 2A according to the second exemplary embodiment of the present disclosure.

FIG. 3 is a block diagram of an equivalent circuit of a light emitting apparatus found in FIG. 2A according to the second embodiment of the present disclosure. Referring to both FIG. 2A and FIG. 3, in the present exemplary embodiment of the disclosure, the light emitting apparatus 200 is not only electrically connected to an outside power supply 262, but the light emitting apparatus 200 can also be electrically connected to a heat dissipation module 302. Therefore, the controller 246 can be electrically connected to the outside power supply 262 through the conductive component 234. Furthermore, the controller 246 can control the operation of the heat dissipation module 302 with the power supply 262.

In some exemplary embodiments of the present disclosure, the heat dissipation module can be a fan, a heat sink, or a cooling module, for instance. After the feedback circuit 244 receives the temperature sensor signal TD, the controller 246 can determine whether the device temperature of the light emitting component 208 is higher than a predetermined value. When the device temperature of the light emitting component 208 is higher than the predetermined value, the controller 246 allows the heat dissipation module 302 to adjust (through the power supply 262) a surrounding temperature or a boundary temperature of the light emitting apparatus 200.

Third Embodiment

Figure 4:
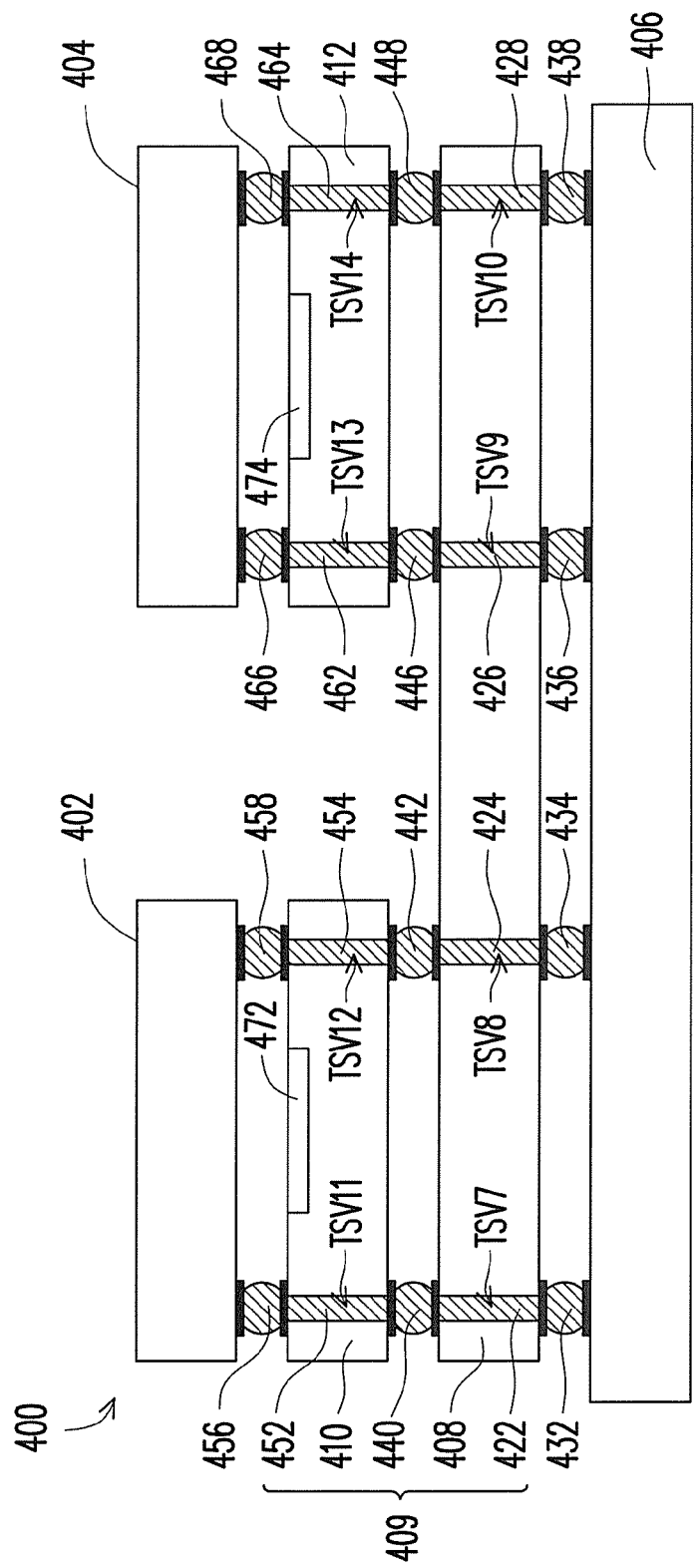
FIG. 4 is a structural diagram illustrating a light emitting apparatus according to the third exemplary embodiment of the present disclosure.

FIG. 4 is a structural diagram illustrating a light emitting apparatus according to the third embodiment of the present disclosure. Referring to FIG. 4, in the present exemplary embodiment of the disclosure, a plurality of light emitting components 402 and 404 can be disposed in the light emitting apparatus 400. Therefore, in the present exemplary embodiment of the disclosure, the light emitting apparatus can emit light of various colors. Similarly, the light emitting apparatus 400 includes a substrate 406 and a chip module 409. Herein, the chip module 409 can include a plurality of functional chips such as the functional chips 408, 410, and 412. As described in the aforementioned exemplary embodiments of the present disclosure, each of the functional chips 408, 410, and 412 includes a plurality of vias, such as vias TSV7, TSV8, TSV9, TSV10, TSV11, TSV12, TSV13, and TSV14, for instance. Similarly, there is a conducting component (422, 424, 426, 428, 452, 454, 462, and 464, for instance) disposed in each of the vias TSV7, TSV8, TSV9, TSV10, TSV11, TSV12, TSV13, and TSV14.

In addition, a plurality of bumps (432, 434, 436, and 438, for instance) can be disposed on the substrate 406. The substrate 406 can be electrically connected to the first terminals of the conductive components 422, 424, 426, and 428 through the corresponding bumps 432, 434, 436, and 438. The bumps 432, 434, 436, and 438 allow the functional chip 408 to be stacked on the substrate 406. There can also be a plurality of bumps 440, 442, 446, and 448 disposed on the functional chip 408. Herein, the bumps 440 and 442 can electrically connect each of the second terminals of the conductive components 422 and 424 to the corresponding first terminals of the conductive components 452 and 454. Therefore, the functional chip 410 can use the bumps 440 and 442 to stack on the functional chip 408.

Similarly, the bumps 446 and 448 can electrically connect each of the second terminals of the conductive components 426 and 428 to the corresponding first terminals of the conductive components 462 and 464. Therefore, the bumps 446 and 442 allow the functional chip 412 and the functional chip 410 to be stacked on the functional chip 408.

There can be a plurality of bumps disposed on the functional chip 410, such as bumps 456 and 458, for instance. The bumps 456 and 458 can electrically connect each of the second terminals of the conductive components 452 and 454 to the light emitting component 402. Therefore, the light emitting component 402 can use the bumps 456 and 458 to stack on the functional chip 410. In addition, there can be a plurality of bumps disposed on the functional chip 412, such as bumps 466 and 468, for instance. The bumps 462 and 464 can electrically connect each of the second terminals of the conductive components 466 and 468 to the light emitting component 404. Therefore, the bumps 456 and 458 allow the light emitting component 404 to be stacked on the functional chip 412.

In the present exemplary embodiment of the disclosure, the functional chips 410 and 412 can both be temperature sensor chips, for instance. The functional chips 410 and 412 include the temperature sensors 472 and 474, respectively. The usage of the temperature sensor chips 410 and 412 can be referred to the temperature sensor chip 206 found in FIG. 2. Therefore, no further descriptions thereof is provided in the present exemplary embodiment of the disclosure. In addition, the functional chip 408 can be a control chip, and the usage thereof is identical to the control chip 404. Particularly, in the present exemplary embodiment of the disclosure, each of the light emitting components 402 and 404 is electrically connected to the temperature sensor chips 410 and 412, respectively. Consequently, the temperature sensor chips 410 and 412, while sensing the device temperatures of the light emitting components 402 and 404, are not affected by the series or parallel connections of the light emitting components 402 and 404. Therefore, the control chip 408 can precisely monitor the device temperatures of the light emitting components 402 and 404.

Fourth Embodiment

Figure 5:
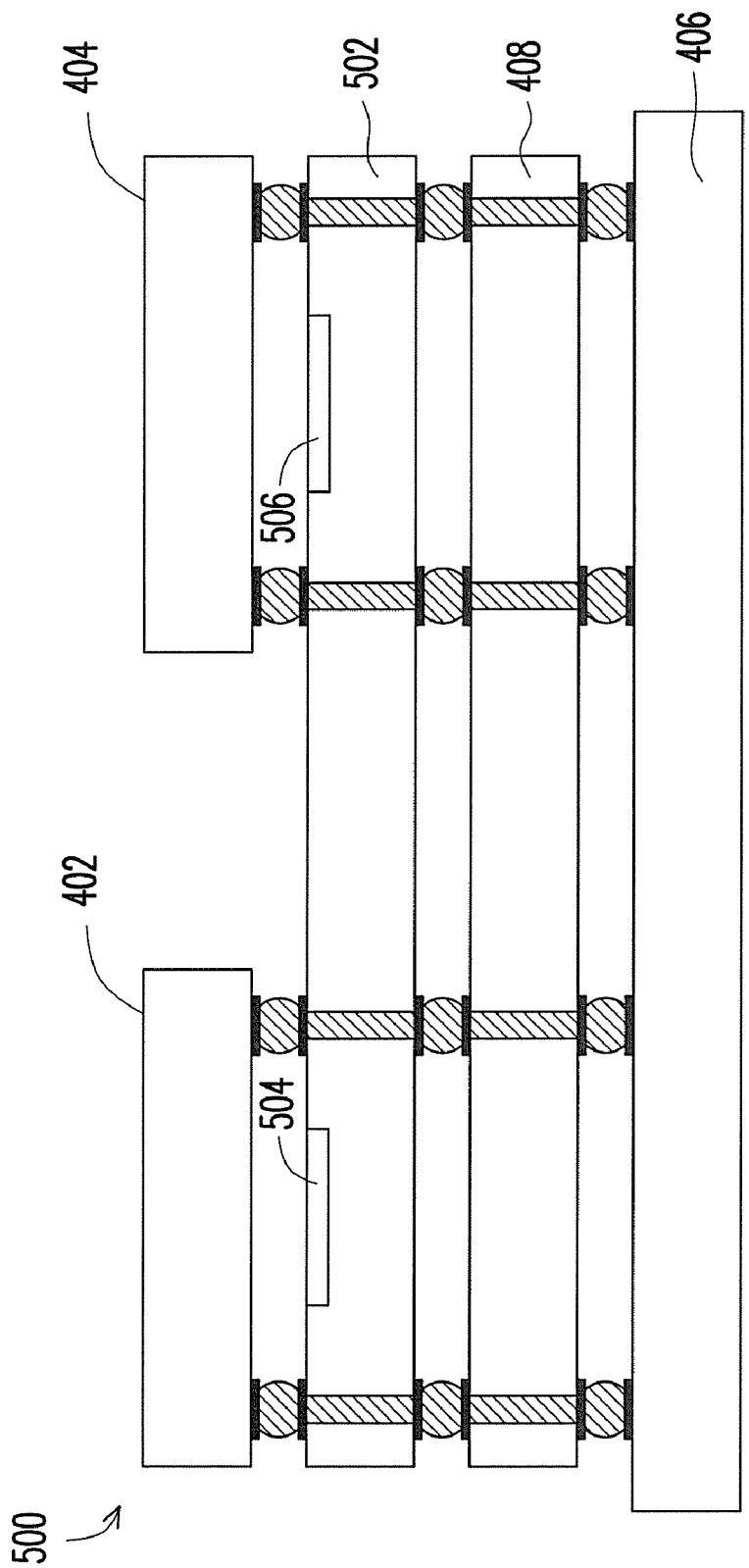
FIG. 5 is a structural diagram illustrating a light emitting apparatus according to the fourth exemplary embodiment of the present disclosure.

FIG. 5 is a structural diagram illustrating the light emitting apparatus according to the fourth embodiment of the present disclosure. Referring to FIG. 5, in the present exemplary embodiment of the disclosure, the provided light emitting apparatus 500 is substantially similar to the structure of the light emitting apparatus 400 found in FIG. 4. In contrast, in the present exemplary embodiment of the disclosure, the functional chips 410 and 412 found in FIG. 4 are replaced by a functional chip 502. Herein, the functional chip 502 can also be a temperature sensor chip. Particularly, a plurality of temperature sensors 504 and 506 can be disposed on the functional chip 502. Each of the temperature sensors 504 and 506 can sense the device temperatures of the corresponding light emitting components 402 and 404. Therefore, the light emitting apparatus 500 of the present exemplary embodiment can also achieve the desired functionality produced by the light emitting apparatus 400 found in FIG. 4.

The Fifth Embodiment

Figure 6A:
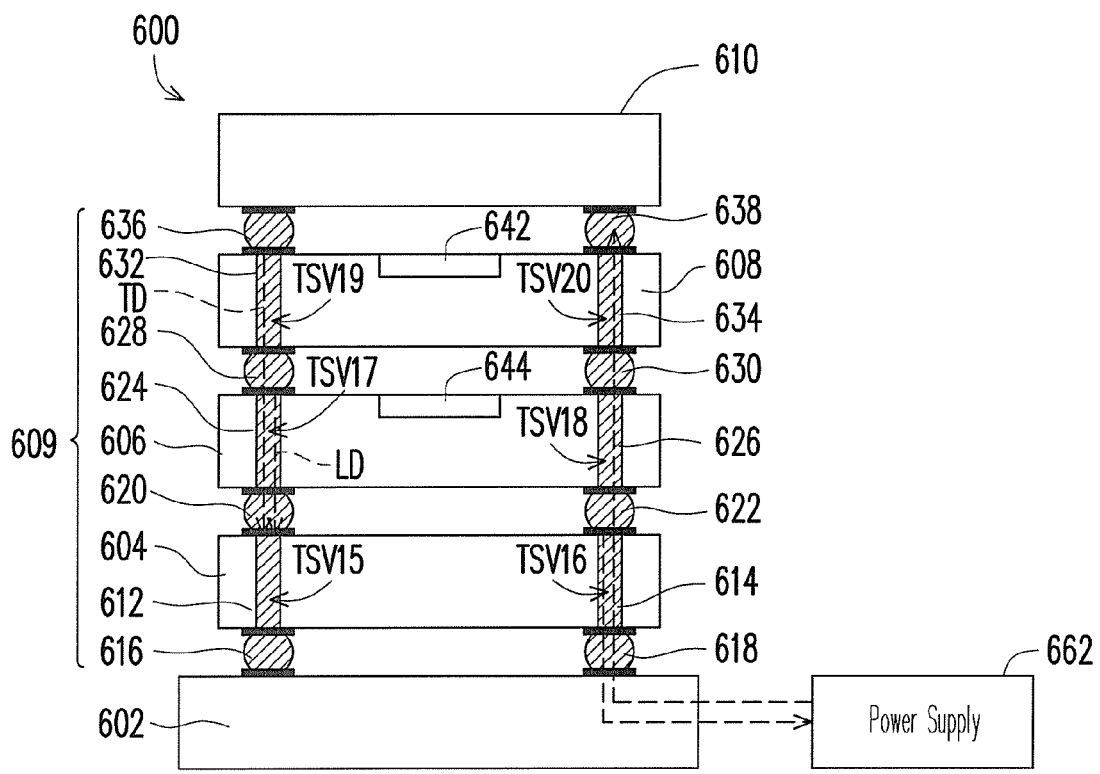
FIG. 6A is a structural diagram illustrating the light emitting apparatus according to the fifth exemplary embodiment of the present disclosure.
Figure 6B:
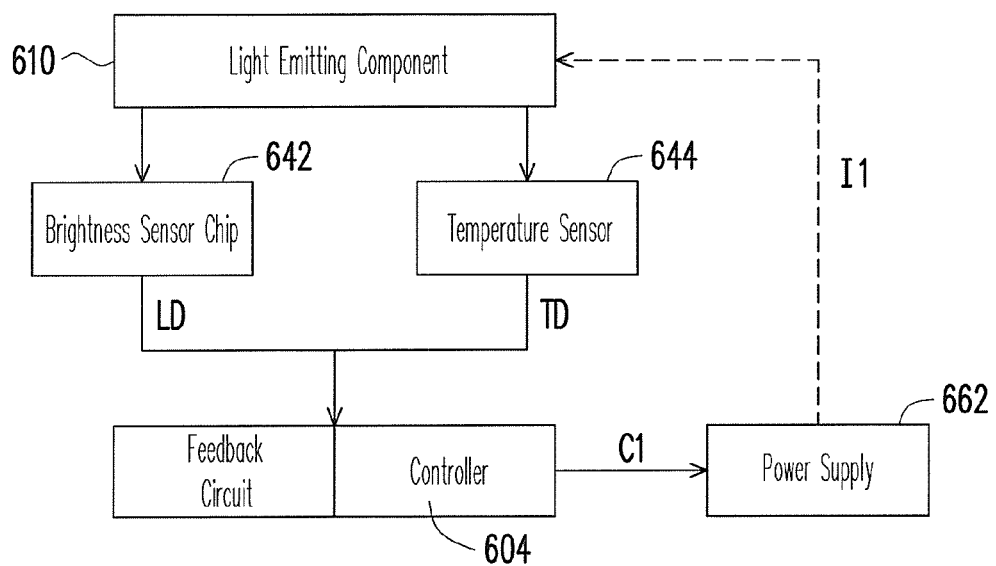
FIG. 6B is a block diagram of an equivalent circuit of the light emitting apparatus found in FIG. 6A.

FIG. 6A is a structural diagram illustrating the light emitting apparatus according to the fifth embodiment of the present disclosure. FIG. 6B is a block diagram of an equivalent circuit of the light emitting apparatus found in FIG. 6A. Referring to both FIG. 6A and FIG. 6B, in the present exemplary embodiment of the disclosure, a light emitting apparatus 600 is provided. The light emitting apparatus 600 includes a substrate 602, a chip module 609, and a light emitting component 610. Similarly, a plurality of bumps (616 and 618, for instance) can be disposed on the substrate 602.

The chip module 609 includes a plurality of functional chips 604, 606, and 608, and each of the functional chips 604, 606, and 608 includes a plurality of vias TSV15, TSV16, TSV17, TSV18, TSV19, and TSV20. Similarly, in each of the vias TSV15, TSV16, TSV17, TSV18, TSV19, and TSV20, a conductive component can be formed (612, 614, 624, 626, 632, and 634, for instance). Herein, the first terminals of the conductive components 612 and 614 can be electrically connected to the first bumps 616 and 618, and thus the first bumps 616 and 618 allow the functional chip 604 to be stacked on the substrate 602.

Similarly, a plurality of bumps (620, 622, 628, 630, 636, and 638, for instance) can be formed on the functional chips 604, 606, and 608. Herein, each of the bumps 620 and 622 electrically connect the second terminals of the conductive components 612 and 624 to the first terminals of the conductive components 624 and 626. In addition, each of the bumps 628 and 630 electrically connect the second terminals of the conductive components 624 and 626 to the first terminals of the conductive components 632 and 634. Furthermore, the second terminals of the conductive components 632 and 634 can be electrically connected to the light emitting component 610 through the bumps 636 and 638. Therefore, the functional chips 606 and 608, along with the light emitting component 610 are stacked on the functional chip 604.

Continuing reference to FIG. 6A and FIG. 6B, the functional chip 604 can be a control chip, and the functional chip 608 can be a temperature sensor chip including a temperature sensor 644. The descriptions of the operation for the functional chip 604 and the temperature sensor chip 608 are identical to the descriptions of the control chip 204 and the temperature sensor chip 206 found in FIG. 3. Therefore, no further descriptions are provided herein. In particular, the functional chip 606 can be a brightness sensor chip that includes a brightness sensor 642. The brightness sensor 642 can be used to sense a brightness value of the light emitting component 610 and generate a brightness sensor signal LD accordingly. The brightness sensor signal LD can be transmitted to the control chip 604 through the conductive component 624 and the bump 620. Therefore, based on the temperature sensor signal TD and the brightness sensor signal LD, the control chip 604 can control the value of the working current for the light emitting component 610.

The Sixth Embodiment

Figure 7:
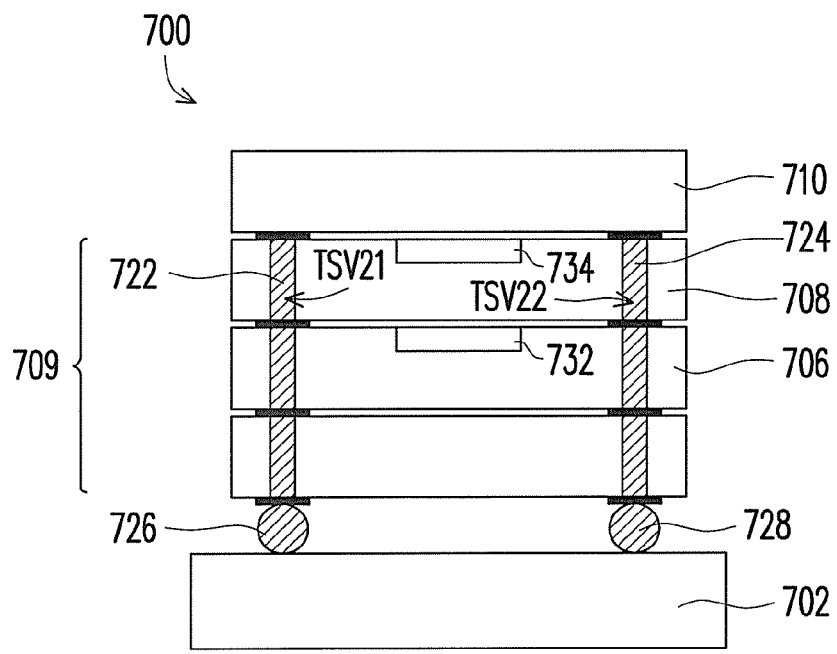
FIG. 7 is a structural diagram illustrating a light emitting apparatus according to the sixth exemplary embodiment of the present disclosure.

FIG. 7 is a structural diagram illustrating a light emitting apparatus according to the sixth embodiment of the present disclosure. Referring to FIG. 7, in the present exemplary embodiment of the disclosure, the provided light emitting apparatus 700 can be fabricated with techniques found in wafer bonding, such as Cu—Cu bonding, $SiO_2$—$SiO_2$ bonding, and adhesive bonding, for instance. The light emitting apparatus 700 found in the present exemplary embodiment of the disclosure also includes a substrate 702, a chip module 709, and a light emitting component 710. Similarly, the bumps 726 and 728 allow the chip module 709 to be stacked on the substrate 702.

The chip module 709 includes the functional chips 704, 706, and 708. In particular, the functional chips 704, 706, and 708, along with the light emitting component 710, are stacked on the substrate 702 in order using wafer bonding techniques. Similarly, a plurality of vias are disposed in each of the functional chips. For instance, the functional chip 708 includes the vias TSV21 and TSV22. A conductive component (722 and 724, for instance) can be formed in each of the vias. Using the conductive components and bumps 726 and 728, the functional chips 704, 706, and 708, along with the light emitting component 710, are electrically connected to the substrate 702. Herein, the functional chip 704 can be a control chip, and each of the functional chips 706 and 708 can be a brightness sensor chip and a temperature sensor chip, respectively. On each of the functional chips 706 and 708, there is a brightness sensor 732 and a temperature sensor 734, respectively. The descriptions of the operation for the functional chips 704, 706, and 708 are identical to the descriptions of the functional chips 604, 606, and 608 found in FIG. 6. Therefore, no further description is provided herein.

Persons of ordinary skill in the art should know, because fabrication for the light emitting apparatus 700 in the present exemplary embodiment of the disclosure is performed with wafer bonding techniques such as Cu—Cu bonding, $SiO_2$—$SiO_2$ bonding, and adhesive bonding, for instance, there is low internal resistance in the light emitting apparatus 700. Consequently, the light emission efficiency is improved for the present exemplary embodiment of the disclosure.

Although the aforementioned exemplary embodiments of the present disclosure describe techniques involving a single substrate, nevertheless, the present disclosure should not be construed as limited to the exemplary embodiments set forth herein. Persons of ordinary skill in the art should know, the number of substrates does not influence the spirit of the present disclosure. Another exemplary embodiment is given for illustration below.

The Seventh Embodiment

Figure 8:
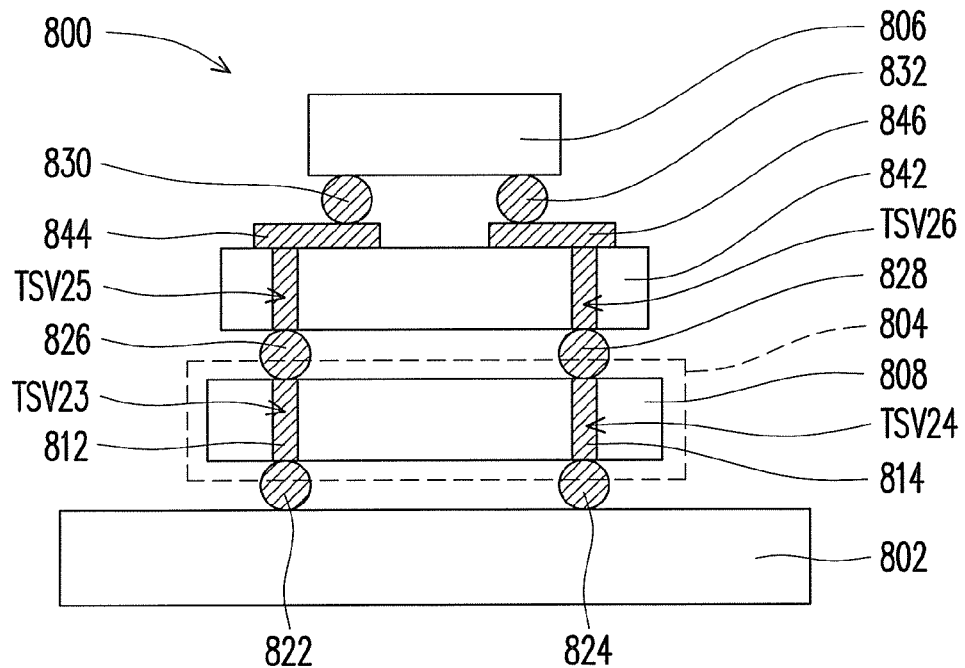
FIG. 8 is a structural diagram illustrating a light emitting apparatus according to the seventh exemplary embodiment of the present disclosure.

FIG. 8 is a structural diagram illustrating a light emitting apparatus according to the seventh embodiment of the present disclosure. Referring to FIG. 8, in the present exemplary embodiment of the disclosure, a light emitting apparatus 800 is provided, in which the light emitting apparatus 800 includes a substrate 802, a chip module 804, and a light emitting component 806. In addition, the chip module 804 includes at least a functional chip 808. A plurality of vias (TSV23 and TSV24, for instance) are disposed in the functional chip 808. Similarly, a conductive component such as conductive components 812 and 814, for instance, is disposed in each of the corresponding vias TSV23 and TSV24. The first terminals of the conductive components 812 and 814 can be electrically connected to the substrate 802 through the bumps 822 and 824. The bumps 822 and 824 allow the chip module 804 to be stacked on the substrate 802. Furthermore, the second terminals of the conductive components 812 and 814 can be electrically connected to the light emitting component 806 through the bumps 826 and 828.

In particular, the light emitting apparatus 800 further includes a substrate 842 sandwiched between the chip module 804 and the light emitting module 806. The substrate 842 also has a plurality of vias, such as TSV25 and TSV26, for instance. Similarly, a conductive component (844 and 846, for instance) is disposed in each of the corresponding vias (TSV25 and TSV26, for instance). Herein, the first terminals for the conductive components 844 and 846 can be electrically connected to the bumps 826 and 828, and the bumps 826 and 828 allow the substrate 842 to be stacked on the chip module 804. In addition, the second terminals of the conductive components 844 and 846 can be electrically connected to the light emitting component 806 through the bumps 830 and 832. Thus, the bumps 830 and 832 allow the light emitting component 806 to be stacked on the substrate 842. From the present exemplary embodiment, the light emitting apparatus of the present disclosure can include a plurality of substrates.

In summary, due to a stacking structure used in the present disclosure, there are advantages of small footprint and higher light emission efficiency. Furthermore, the present disclosure provides a plurality of functional chips used for detecting various characteristic parameters.

Although the present disclosure has been revealed by the above exemplary embodiments, they are not intended to limit the present disclosure. Anybody skilled in the art may make some modifications and alterations without departing from the spirit and scope of the present disclosure. Therefore, the protection range of the present disclosure falls in the appended claims.

What is claimed is:

1. A light emitting apparatus comprising:
    a chip module comprising a first functional region having a plurality of first vias, the first functional region comprising at least one of a temperature sensor and a brightness sensor;
        a plurality of first conductive components disposed in the plurality of first vias respectively;
        a plurality of first bumps disposed on and electrically connected to a plurality of corresponding first terminals of the plurality of first conductive components respectively;
        a plurality of second bumps disposed on and electrically connected to a plurality of corresponding second terminals of the plurality of first conductive components respectively, wherein the first bumps and the second bumps are located on two opposite surfaces of the first functional region; and
    a first light emitting component adjacently stacked on the first functional region of the chip module and electrically connected to the plurality of second bumps.

2. The light emitting apparatus as claimed in claim 1, further comprising a substrate electrically connected to the plurality of first bumps, so that the chip module uses the plurality of first bumps to stack on the substrate.

3. The light emitting apparatus as claimed in, claim 1, wherein the first functional region includes a temperature sensor chip having a temperature sensor used to sense an operational temperature of the first light emitting component and generate a temperature sensor signal.

4. The light emitting apparatus as claimed in claim 3, wherein the chip module further comprises:
    a plurality of third bumps, disposed on the first functional region, and each of the plurality of third bumps is electrically connected to a corresponding second terminal of one of the plurality of first conductive components;
    a second functional chip having a plurality of second vias; and
    a plurality of second conductive components disposed in the plurality of second vias respectively,
        wherein a first terminal of each of the plurality of second conductive components is electrically connected to one of the plurality of third bumps respectively, so that the second functional chip uses the plurality of third bumps to stack on the first functional region, and a second terminal of each of plurality of the second conductive components is electrically connected to one of the plurality of second bumps respectively.

5. The light emitting apparatus as claimed in claim 4, wherein the second functional chip comprises:
    a feedback circuit, electrically connected to the temperature sensor chip through the plurality of second conductive components and through the plurality of third bumps for receiving the temperature sensor signal; and
    a controller, electrically connected to the first light emitting component through the plurality of second conductive components and through the plurality of second bumps for controlling an amount of a working current flowing into the first light emitting component according to the temperature sensor signal.

6. The light emitting apparatus as claimed in claim 4, wherein the chip module further comprises:
    a plurality of fourth bumps, disposed on the second functional chip, and each of the plurality of fourth bumps is electrically connected to the second terminal of one of the plurality of second conductive components respectively;
    a third functional chip, having a plurality of third vias; and
    a plurality of third conductive components, disposed in the plurality of third vias respectively,
    wherein a first terminal of each of the plurality of third conductive components is electrically connected to one of the plurality of fourth bumps respectively, so that the third functional chip uses the plurality of fourth bumps to stack on the second functional chip, and a second terminal of each of the plurality of third conductive components is electrically connected to one of the plurality of second bumps respectively.

7. The light emitting apparatus as claimed in claim 6, wherein the third functional chip is a brightness sensor chip having a brightness sensor for detecting a brightness value from the first light emitting component and generating a brightness sensor signal.

8. The light emitting apparatus as claimed in claim 1, wherein the first light emitting component is a light emitting diode.

9. The light emitting apparatus as claimed in claim 1, wherein the first light emitting component is a laser diode.

10. The light emitting apparatus as claimed in claim 1, further comprising a second light emitting component, wherein each of the first light emitting component and the second light emitting component is electrically connected to one of the plurality of second bumps respectively, and the first light emitting component and the second light emitting component are stacked on the chip module.

11. The light emitting apparatus as claimed in claim 1, wherein an electrical connection between the first light emitting component and the first functional region is made by copper bonding from a wafer bonding process.

12. The light emitting apparatus as claimed in claim 1, wherein the electrical connection between the first light emitting component and the first functional region are insulated from each other by silicon dioxide bonding from a wafer bonding process.

13. The light emitting apparatus as claimed in claim 1, wherein the electrical connection between the first light emitting component and the first functional region are insulated from each other by adhesive bonding from a wafer bonding process.

14. The light emitting apparatus as claimed in claim 10, further comprising:
a second substrate, disposed between the chip module and the first light emitting component, wherein the second substrate has a plurality of fourth vias;
a plurality of fourth conductive components, disposed in the plurality of fourth vias respectively, and a first terminal of each of the plurality of fourth conductive components is electrically connected to one of the plurality of second bumps, so that the second substrate uses the plurality of second bumps to stack on the chip module; and
a plurality of fifth bumps, electrically connected to the a plurality of corresponding second terminal of the plurality of fourth conductive components respectively and the first light emitting component, so that the second light emitting component uses the plurality of fifth bumps to stack on the second substrate.

15. A method for fabricating a light emitting apparatus, comprising:
providing a chip module and a light emitting component, wherein the chip module has a first functional region, the first functional region comprising at least one of a temperature sensor and a brightness sensor;
forming a plurality of first vias in the first functional region;
forming a plurality of conductive components in the plurality of first vias respectively;
forming a plurality of first bumps and each of the plurality of first bumps being electrically connected to a first terminal of one of the plurality of first conductive components;
forming a plurality of second bumps and each of the plurality of second bumps being electrically connecting a second terminals of one of the plurality of first conductive components respectively; and
adjacently stacking the light emitting component onto the first functional chip of the chip module and electrically connecting the light emitting component to the plurality of second bumps.

16. The method of fabricating the light emitting apparatus as claimed in claim 15, the method further comprises providing a substrate and electrically connecting the substrate to the plurality of first bumps, so that the chip module uses the plurality of first bumps to stack on the substrate.

17. The method of fabricating the light emitting apparatus as claimed in claim 15, the method further comprises using the first functional region to sense a characteristic parameter of the light emitting component during operation for generating a first sensor signal.

18. The method of fabricating the light emitting apparatus as claimed in claim 17, wherein the characteristic parameter is a temperature parameter.

19. The method of fabricating the light emitting apparatus as claimed in claim 17, wherein the characteristic parameter is a brightness parameter.

20. The method of fabricating the light emitting apparatus as claimed in claim 17, the method further comprising:
providing a second functional chip in the chip module;
forming a plurality of third bumps on the first functional region, and each of the plurality of third bumps is electrically connected to a second terminal of one of the plurality of first conductive components respectively;
forming a plurality of second vias in the second functional chip; and
forming a plurality of second conductive components in each of the plurality of second vias respective, and electrically connecting a first terminal of each of the plurality of second conductive components to one of the plurality of third bumps, so that the second functional chip uses the plurality of third bumps to stack on the first functional region, wherein a second terminal of each of the plurality of second conductive components being coupled to one of the plurality of second bumps respectively.

21. The method of fabricating the light emitting apparatus as claimed in claim 15, wherein the light emitting component is a laser diode.

22. The method of fabricating the light emitting apparatus as claimed in claim 15, wherein the light emitting component is a light emitting diode.

23. The method of fabricating the light emitting apparatus as claimed in claim 15, wherein an electrical connection between the first light emitting component and the first functional region is made by copper bonding from a wafer bonding process.

24. The method of fabricating the light emitting apparatus as claimed in claim 15, wherein the electrical connection between the first light emitting component and the first functional region are insulated from each other by silicon dioxide bonding from a wafer bonding process.

25. The method of fabricating the light emitting apparatus as claimed in claim 15, wherein the electrical connection between the first light emitting component and the first functional region are insulated from each other by adhesive bonding from a wafer bonding process.

26. A light emitting apparatus comprising:
a chip module comprising a temperature sensor and a brightness sensor, wherein the temperature sensor has a plurality of vias, the brightness sensor has a plurality of vias, the temperature sensor and the brightness sensor are arranged side by side;
a plurality of conductive components disposed in the vias of the temperature sensor and the brightness sensor respectively;
a plurality of bumps disposed on two terminals of each of the conductive components;
a light emitting component adjacently stacked on a first surface of the chip module, wherein the light emitting component is electrically connected to the temperature sensor and the brightness sensor through the bumps respectively; and a functional chip adjacently stacked on a second surface opposite to the first surface of the chip module and having a feed back circuit and a controller, wherein the chip module is sandwiched between the light emitting component and the functional chip, the feed back circuit is electrically connected to the temperature sensor and the brightness sensor through the conductive components and the bumps correspondingly, the controller is electrically connected to the light emitting component through the conductive components and the bumps correspondingly.

27. The light emitting apparatus as claimed in claim 26, further comprising a substrate electrically connected to the plurality of bumps, so that the chip module uses the plurality of bumps to stack on the substrate.

28. The light emitting apparatus as claimed in claim 26, wherein the temperature sensor senses an operational temperature of the light emitting component and generate a temperature sensor signal.

29. The light emitting apparatus as claimed in claim 26, wherein the feedback circuit is electrically connected to the temperature sensor through the plurality of conductive components and electrically connected to the brightness sensor through the plurality of conductive components, and the controller is electrically connected to the light emitting component through the plurality of conductive components.

30. The light emitting apparatus as claimed in claim 26, wherein the brightness sensor detects a brightness value from the light emitting component and generating a brightness sensor signal.

31. The light emitting apparatus as claimed in claim 26, wherein the light emitting component is a light emitting diode.

32. The light emitting apparatus as claimed in claim 26, wherein the light emitting component is a laser diode.

33. The light emitting apparatus as claimed in claim 26, further comprising a second light emitting component, wherein each of the light emitting component and the second light emitting component is electrically connected to one of the plurality of bumps respectively, and the light emitting component and the second light emitting component are stacked on the chip module.

34. The light emitting apparatus as claimed in claim 26, wherein an electrical connection between the light emitting component and the chip module is made by copper bonding from a wafer bonding process.

35. The light emitting apparatus as claimed in claim 26, wherein the electrical connection between the light emitting component and the chip module is made by silicon dioxide bonding from a wafer bonding process.

36. The light emitting apparatus as claimed in claim 26, wherein the electrical connection between the light emitting component and the chip module is made by adhesive bonding from a wafer bonding process.

* * * * *